(12) United States Patent
Wright

(10) Patent No.: US 6,791,366 B1
(45) Date of Patent: Sep. 14, 2004

(54) CIRCUIT FOR IMPLEMENTING PRODUCT TERM INPUTS

(75) Inventor: Andrew J. Wright, Mountain View, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 326 days.

(21) Appl. No.: 09/605,312

(22) Filed: Jun. 28, 2000

(51) Int. Cl.[7] .................... H03K 19/20; H03K 19/177
(52) U.S. Cl. ........................................ 326/113; 326/47
(58) Field of Search .................. 326/112–114, 119, 326/121–122, 44–45, 37–39, 47, 49–50

(56) References Cited

U.S. PATENT DOCUMENTS

| 4,879,688 | A | * | 11/1989 | Turner et al. .......... 365/185.22 |
| 4,992,679 | A | * | 2/1991 | Takata et al. .................. 326/38 |
| 5,233,233 | A | * | 8/1993 | Inoue et al. ................. 327/408 |
| 5,412,599 | A |   | 5/1995 | Daniele et al. ............. 365/185 |
| 5,687,107 | A | * | 11/1997 | Igura .......................... 708/670 |
| 5,889,413 | A | * | 3/1999 | Bauer ........................... 326/40 |
| 5,952,846 | A | * | 9/1999 | Silver .......................... 326/41 |
| 6,194,914 | B1 | * | 2/2001 | Sako ........................... 326/113 |
| 6,359,466 | B1 | * | 3/2002 | Sharpe-Geisler ............. 326/37 |

FOREIGN PATENT DOCUMENTS

JP 61173518 A * 8/1986 .......... H03K/19/00

* cited by examiner

Primary Examiner—James H. Cho
(74) Attorney, Agent, or Firm—Christopher P. Maiorana, P.C.

(57) ABSTRACT

An apparatus comprising a polarity switch. The polarity switch may comprise a number of transmission gates. An output of the polarity switch may selectably present either (i) a signal that varies in response to a control signal or (ii) a predetermined logic level that is independent of the control signal.

20 Claims, 6 Drawing Sheets

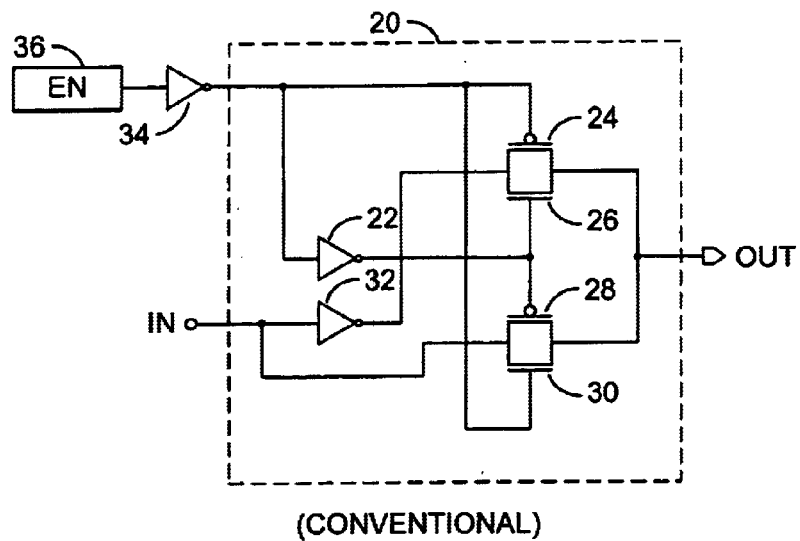
(CONVENTIONAL)
FIG. 1
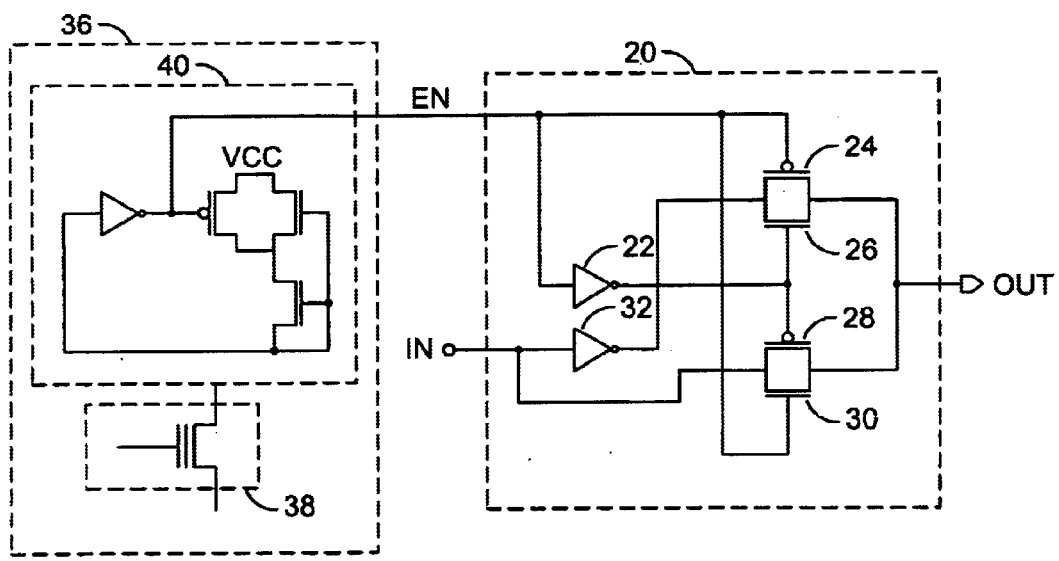
(CONVENTIONAL)
FIG. 2

CIRCUIT FOR IMPLEMENTING PRODUCT TERM INPUTS

FIELD OF THE INVENTION

The present invention relates to a method and/or architecture for input circuits generally and, more particularly, to a method and/or architecture for implementing a circuit for product term inputs.

BACKGROUND OF THE INVENTION

A programmable logic device (PLD) provides an economical and efficient means for implementing predetermined Boolean logic functions in an integrated circuit. Such a device consists of, generally, an AND plane configured to generate predetermined product terms in response to a plurality of inputs, a group of fixed/programmable OR gates configured to generate a plurality of sum-of-product(SOP) terms in response to the product terms, and a number of logic elements (i.e., macrocells) configured to generate a desired output in response to the sum-of-products terms. The sum-of-products terms can also be generated using programmable NOR-NOR logic.

The arrangement and operation of components within the PLD are programmed by architecture configuration bits. The architecture configuration bits are set prior to normal operation of the PLD. The configuration bits can be stored in volatile memory (i.e., SRAM) or non-volatile memory (i.e., EEPROM/flash). The bits are set using an operation called "programming" or "configuration".

Depending upon the Boolean function implemented, the plurality of inputs to the AND plane of the PLD can require a number of input signals, digital complements of the input signals, and logic levels (i.e., "0" or "1"). The plurality of inputs are presented by product term input circuits. In order to maximize the number of input signals to a PLD (i.e., avoid sacrificing an input to generate a logic level), the product term input circuits need to be able to select either an input signal, a complement of the input signal, or a logic level.

Referring to FIG. 1, a schematic-diagram of a circuit 20 illustrating a conventional polarity switch is shown. The circuit 20 has an inverter 22, a PMOS transistor 24, a NMOS transistor 26, a PMOS transistor 28, a NMOS transistor 30, and an inverter 32. The transistors 24 and 26 form a first transmission gate and the transistors 26 and 28 form a second transmission gate. An enable signal EN is presented to an input of an inverter 34 via a pad 36. An output of the inverter 34 presents a signal to an input of the inverter 22, a gate of the transistor 24, and a gate of the transistor 30. An output of the inverter 22 presents a signal to a gate of the transistor 26 and a gate of the transistor 28. An input signal IN is presented to an input of the inverter 32 and a first source/drain of the transistors 28 and 30. An output of the inverter 32 is presented to a first source/drain of the transistors 24 and 26. A second source/drain of the transistors 24, 26, 28, and 30 are connected to form a node at which an output signal OUT is presented. Depending upon the state of the enable signal EN, either the signal IN or a complement of the signal IN will be presented as the signal OUT.

Referring to FIG. 2, a schematic diagram of a circuit 36 illustrating a memory cell generating the enable signal EN of FIG. 2 is shown. The circuit 36 comprises a non-volatile memory cell 38 and a driver circuit 40. An output of the memory cell is presented to an input of the driver circuit 40. The driver circuit 40 comprises an inverter 42, a transistor 44, a transistor 46 and a transistor 48. The signal from the memory cell 38 is presented to an input of the inverter 42, a gate of the transistor 46 and a gate and source of the transistor 48. An output of the inverter 42 presents the signal EN to the circuit 20 and a gate of the transistor 44. A source of the transistor 44 is connected to a source of the transistor 46 and a supply voltage VCC. A drain of the transistors 44, 46, and 48 are connected together.

The circuit 20 can present only the signal IN or a complement of the signal IN. The circuit 20 requires eight transistors. In order to select between the signal IN, a complement of the signal IN, and a logic level, a product term input circuit would require two of the circuits 20. The product term input circuits account for a significant portion of the transistors in a PLD. Doubling the number of transistors needed for a product term input circuit with redundant logic is undesirable. Since the product term input circuits account for a significant portion of the transistors in a PLD, a product term input circuit that could select between signal polarities and logic levels with fewer transistors would be desirable.

SUMMARY OF THE INVENTION

The present invention concerns an apparatus comprising a polarity switch. The polarity switch may comprise a number of transmission gates. An output of the polarity switch may selectably present either (i) a signal that varies in response to a control signal or (ii) a predetermined logic level that is independent of the control signal.

The objects, features and advantages of the present invention include providing a method and/or architecture for implementing a product term input circuit that may (i) be implemented in a complex programmable logic device (CPLD), (ii) provide a reduction in the number of transistors needed for implementing product term inputs, (iii) provide a reduction in area for implementing the same number of product term inputs, (iv) provide the capability to implement a larger number of product term inputs in a given area and/or (v) provide a reduction in interconnect length and/or a reduction in delay on a CPLD.

BRIEF DESCRIPTION OF THE DRAWINGS

These and other objects, features and advantages of the present invention will be apparent from the following detailed description and the appended claims and drawings in which:

FIG. 1 is a block diagram illustrating a conventional polarity switch;

FIG. 2 is a block diagram illustrating control of the polarity switch of FIG. 3 by a non-volatile memory cell;

DETAILED DESCRIPTION OF THE PREFERRED EMBODIMENTS

Figure 3:
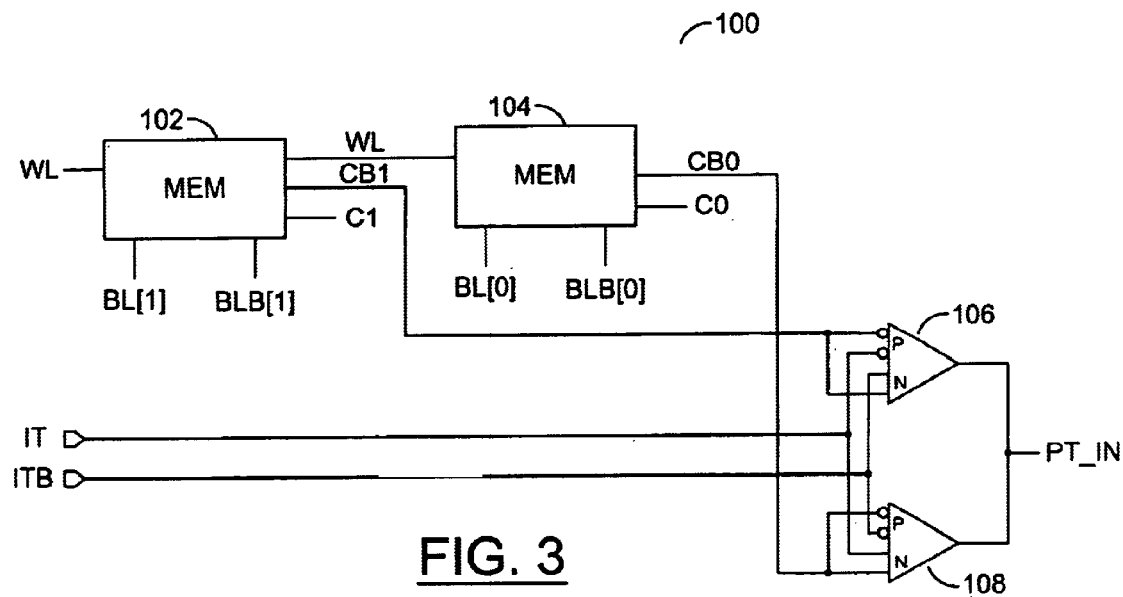
FIG. 3 is a block diagram conceptually illustrating a polarity switch with a 0 or 1 over-ride.

Referring to FIG. 3, a block diagram of a circuit 100 illustrating a product term input circuit is shown. The circuit 100 may comprise two memory cells 102 and 104 and two speed-optimized tri-state inverters 106 and 108. The memory cells 102 and 104 may be programmed, in one example, using a single wordline (e.g., WL) and a number of bitlines (e.g., BL[1:0] and BLB[1:0]). However, other configurations of wordlines and bitlines may be implemented. For example, common bitlines and independent wordlines may be implemented without affecting operation of the circuit 100. The memory cell 102 may have an output that may present a signal (e.g., CB1) to an inverting input and a non-inverting input of the inverter 106. The memory cell 104 may have an output that may present a signal (e.g., CB0) to an inverting input and a non-inverting input of the inverter 108. An input signal (e.g., IT) may be presented to an inverting input of the inverter 106 and a non-inverting input of the inverter 108. A digital complement of the input signal IT (e.g., ITB) may be presented to a non-inverting input of the inverter 106 and an inverting input of the inverter 108. An output of the inverters 106 and 108 may be connected together to form an output node. An output signal (e.g., PT_IN) may be presented at the output node. Example operations of the circuit 100 may be summarized as in the following TABLE 1:

TABLE 1

| C0 | CB0 | C1 | CB1 | IT | ITB | PT_IN |
|---|---|---|---|---|---|---|
| 1 | 0 | 1 | 0 | 0 | D | 1 |
| 1 | 0 | 1 | 0 | D | 0 | 1 |
| 1 | 0 | 1 | 0 | 1 | 1 | z |
| 1 | 0 | 0 | 1 | X | /X | /ITB = IT |
| 0 | 1 | 1 | 0 | /X | X | /IT = ITB |
| 0 | 1 | 0 | 1 | 1 | D | 0 |
| 0 | 1 | 0 | 1 | D | 1 | 0 | where D indicates that the signal does not affect the signal PT_IN, X indicates multiple states, and/indicates a logical inversion.

Figure 4:
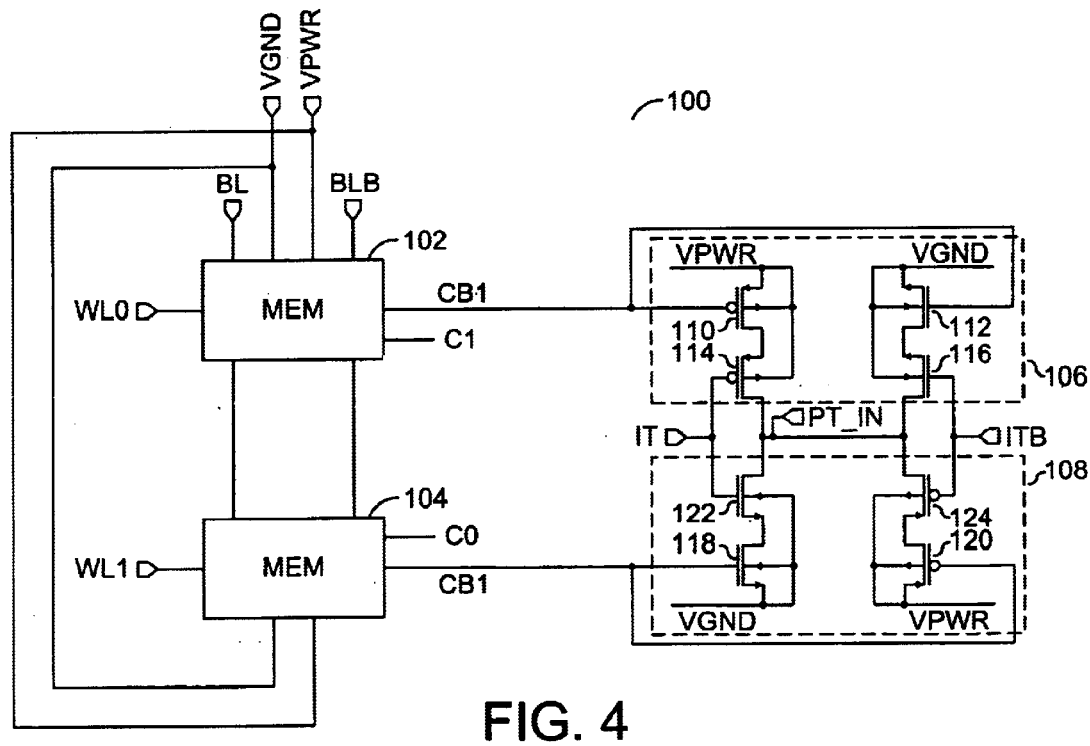
FIG. 4 is a schematic diagram illustrating a transistor implementation of the polarity switch of FIG. 3.

Referring to FIG. 4, a more detailed block diagram of the circuit 100 illustrating an implementation of the inverters of FIG. 3 is shown. The circuit 100 may comprise memory cells 102 and 104. The memory cells 102 and 104 may be connected to the same bitlines (e.g., BL and BLB) and have independent wordlines (e.g., WL0 and WL1, respectively). Each of the circuits 106 and 108 may be implemented, in one example, with four transistors. The inverter 106 may comprise a transistor 110, a transistor 112, a transistor 114, and a transistor 116. The inverter 108 may comprise a transistor 118, a transistor 120, a transistor 122, and a transistor 124.

Figure 5:
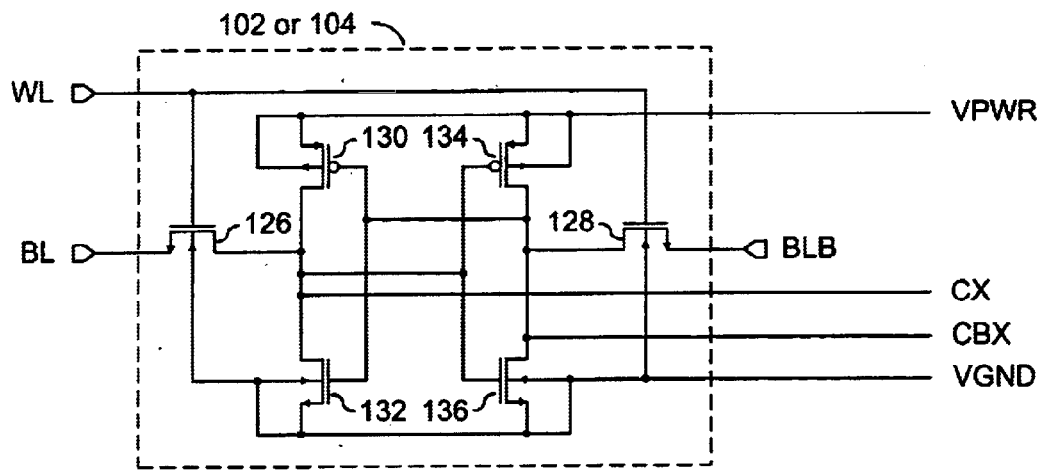
FIG. 5 is a schematic diagram illustrating a transistor implementation of a memory cell of FIGS. 3 and 4.

Referring to FIG. 5, a schematic diagram of a memory cell of FIGS. 3 and 4 is shown. The memory cell may comprise a transistor 126, a transistor 128, a transistor 130, a transistor 132, a transistor 134 and a transistor 136. The signal WL may be presented to a gate of the transistor 126 and a gate of the transistor 128. The signal BL is presented to a source of the transistor 126. The signal BLB is presented to a source of the transistor 128. A drain of the transistor 126 may be connected to a drain of the transistor 130, a drain of the transistor 132, a gate of the transistor 134 and a gate of the transistor 136. A drain of the transistor 128 may be connected to a drain of the transistor 134, a drain of the transistor 136, a gate of the transistor 130, and a gate of the transistor 132. A source of the transistors 130 and 134 may be connected to a supply voltage (e.g., VPWR). A source of the transistors 132 and 136 may be connected to a ground potential (e.g., VGND). When transistors having a substrate terminal are used to implement the memory cell, the substrate terminals of the transistors 126, 128, 132 and 136 may be connected to the ground potential VGND. The substrate terminals of the transistors 130 and 134 may be connected to the supply voltage VPWR. However, other substrate connections may be implemented to meet design criteria of a particular application. The memory cell may present a configuration bit signal (e.g., Cx) at the node formed by the drains of the transistor 126, 130 and 132. A digital complement of the configuration bit signal (e.g., CBx) may be presented at a node formed by the drains of the transistors 128, 134 and 136.

Figure 6:
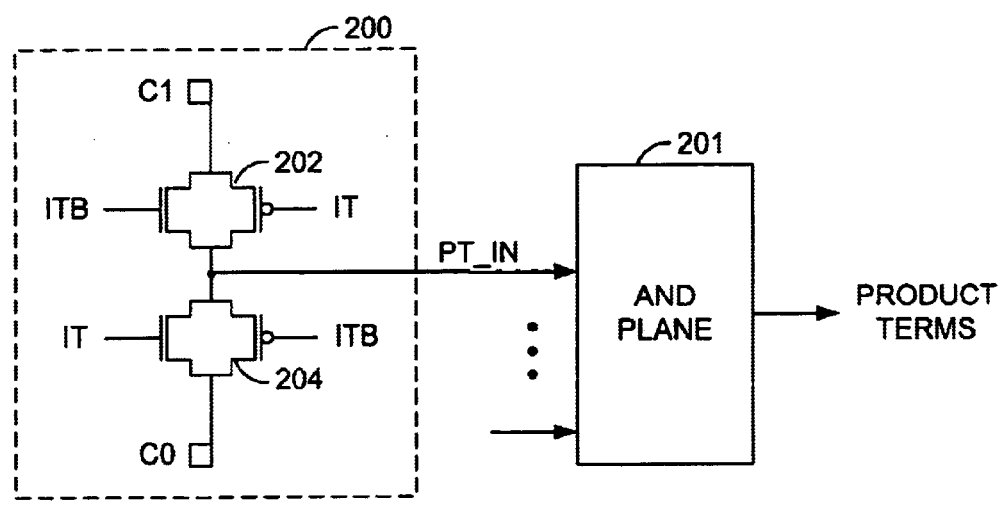
FIG. 6 is a block diagram illustrating a preferred embodiment of the present invention.

Referring to FIG. 6, a block diagram of a circuit 200 illustrating a preferred embodiment of the present invention is shown. The circuit 200 may be implemented as a product term input circuit of a programmable logic device. The circuit 200 may have an input that may receive the signal IT, an input that may receive the signal ITB, an input that may receive the signal C0, an input that may receive the signal C1, and an output that may present the signal PT_IN to one of a plurality of inputs of an AND plane 201. The AND plane 201 may be configured to generate product terms in response to the plurality of inputs. The signals C0 and C1 may be configuration bits of a programmable logic device. The circuit 200 may be configured to present the signal C0 or the signal C1 as the signal PT_IN in response to the signals IT and ITB. By selecting appropriate values for the signals C0 and C1, the circuit 200 may be configured to present the signal PT_IN as (i) a logic level that is independent of the signals IT and ITB or (ii) a signal that may change state similarly to either the signal IT or the signal ITB. An example operation of the circuit 200 may be summarized as in the following TABLE 2:

TABLE 2

| C0 | C1 | PT_IN |
|---|---|---|
| 0 | 0 | 0 |
| 0 | 1 | ITB |
| 1 | 0 | IT |
| 1 | 1 | 1 |

The circuit 200 may be implemented to balance a sacrifice of stage speed for a reduction in die size, interconnect length and overall delays.

The circuit 200 may comprise a transmission gate 202 and a transmission gate 204. The transmission gates 202 and 204 may be implemented, in one example, as CMOS transmission gates. The signal C1 may be presented to an input of the transmission gate 202. The signal ITB may be presented to an active HIGH control input of the transmission gate 202. The signal IT may be presented to an active LOW control input of the transmission gate 202. The signal C0 may be presented to an input of the transmission gate 204. The signal ITB may be presented to an active LOW control input of the transmission gate 204. The signal IT may be presented to an active HIGH control input of the transmission gate 204. The signals IT and ITB may be used as control signals for the transmission gates 202 and 204.

When the signal IT is in a first state (e.g., a digital 0, or LOW), the transmission gate 202 will generally present the signal C1 as the signal PT_IN. When the signal IT is in a second state (e.g., a digital 1, or HIGH), the transmission gate 204 will generally present the signal C0 as the signal PT_IN. The signals C0 and C1 may control the circuit 200 such that the signal PT_IN may be (i) in the same state as the signal IT, (ii) in the same state as the signal ITB, (iii) a logical 0, or (iv) a logical 1.

Figure 7:
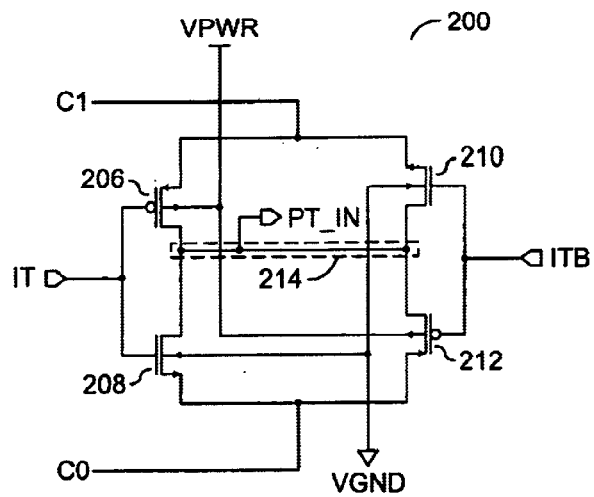
FIG. 7 is a schematic diagram illustrating a polarity switch implemented in accordance with a preferred embodiment of the present invention.

Referring to FIG. 7, a more detailed schematic diagram illustrating an implementation of the circuit 200 is shown. The circuit 200 may comprise a transistor 206, a transistor 208, a transistor 210, and a transistor 212. The transistors 206 and 212 may be implemented as one or more PMOS transistors. The transistors 208 and 210 may be implemented as one or more NMOS transistors. However, other types and polarities of transistors may be implemented accordingly to meet the design criteria of a particular application. The signal IT may be presented to a gate of the transistor 206 and a gate of the transistor 208. The signal ITS may be presented to a gate of the transistor 210 and a gate of the transistor 212. The signal C0 may be presented to a source of the transistor 208 and a source of the transistor 212. The signal C1 may be presented to a source of the transistor 206 and a source of the transistor 210. A drain of the transistors 206, 208, 210 and 212 may be connected together to form a node 214. The signal PT_IN may be presented at the node 214. The circuit 200 may be implemented, in one example, using transistors having a substrate terminal. When the circuit 200 is implemented with transistors having a substrate terminal, the substrate terminal of the transistors 206 and 212 may be connected to the supply voltage VPWR. The substrate terminals of the transistors 208 and 210 may be connected to the supply voltage ground VGND. However, other connections to the substrates may be implemented to meet the design criteria of a particular application.

Figure 8:
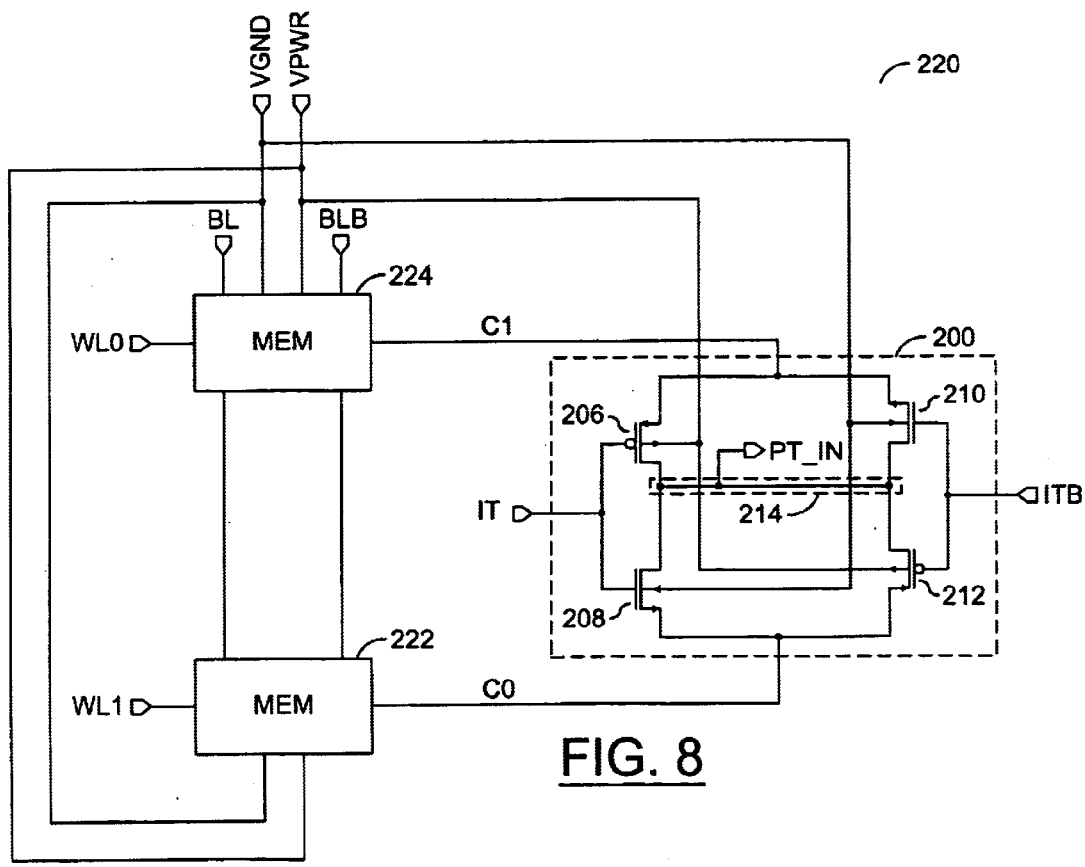
FIG. 8 is a block diagram illustrating the polarity switch of FIG. 7 implemented in the context of a memory based PLD.

Referring to FIG. 8, a block diagram illustrating the circuit 200 implemented in the context of a memory based programmable logic device 220 is shown. The PLD 220 may have configuration bits stored in a number of memory cells. In one example, the PLD 220 may have a memory cell 222 and a memory cell 224. The memory cell 222 may be configured to store a first value in response to the wordline WL0 and the bitlines BL and BLB. The memory cell 222 may have an output that may present the signal C0. The signal C0 may be indicative of a value of a configuration bit (e.g., a logical 0 or 1) stored in the memory cell 222. Similarly, the memory cell 224 may be configured to store a second value in response to the wordline WL1 and the bitlines BL and BLB. The memory cell 224 may have an output that may present the signal C1. The signal C1 may be indicative of a value of a configuration bit stored in the memory cell 224. The memory cells 222 and 224 may be configured to source and sink a current.

Figure 9:
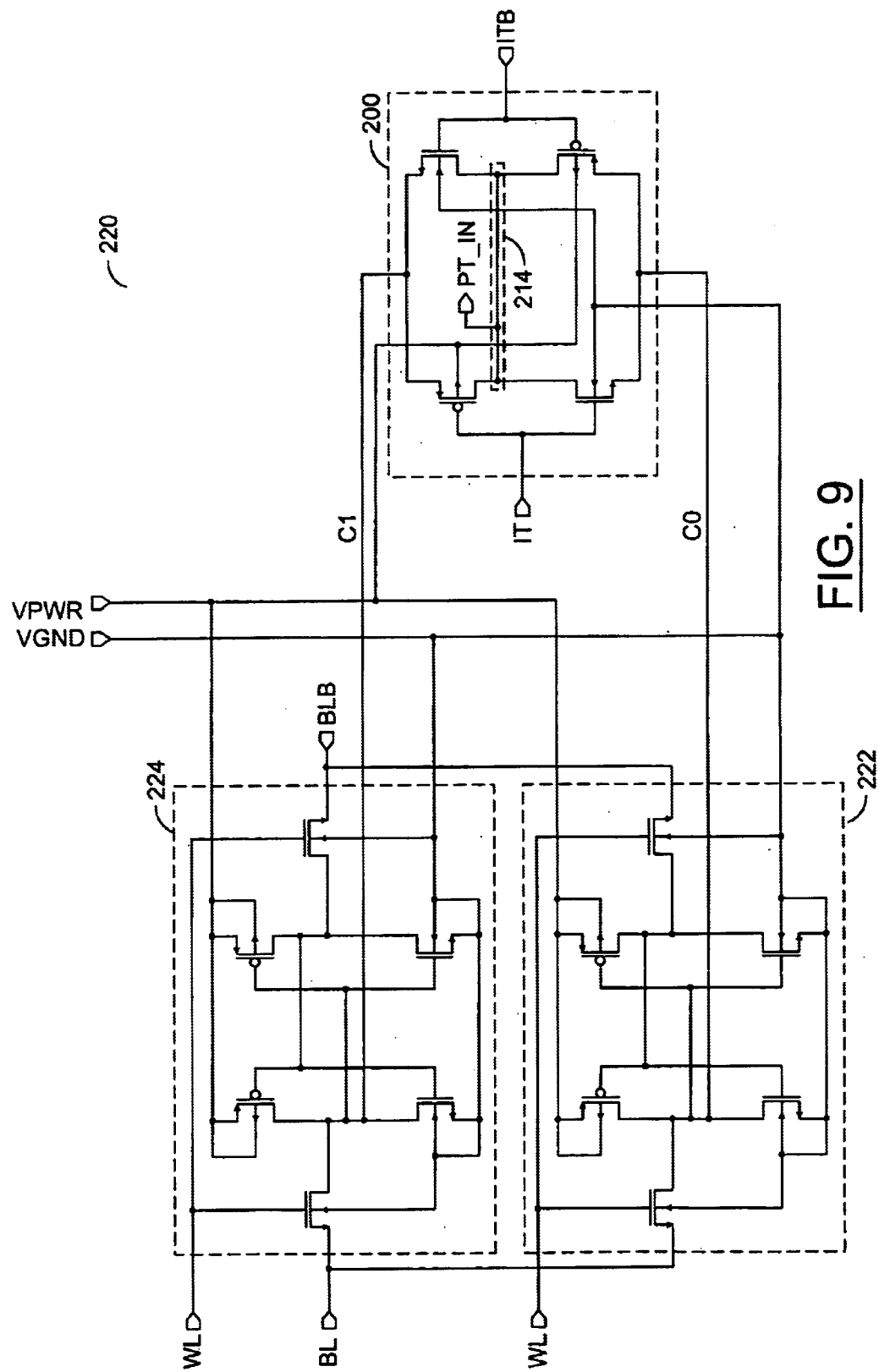
FIG. 9 is a schematic diagram illustrating an embodiment of the present invention.

Referring to FIG. 9, a schematic diagram illustrating an implementation of the circuit 220 of FIG. 8 is shown. The memory cells 222 and 224 may be implemented in accordance with the transistor circuit described in connection with FIG. 5.

Figure 10:
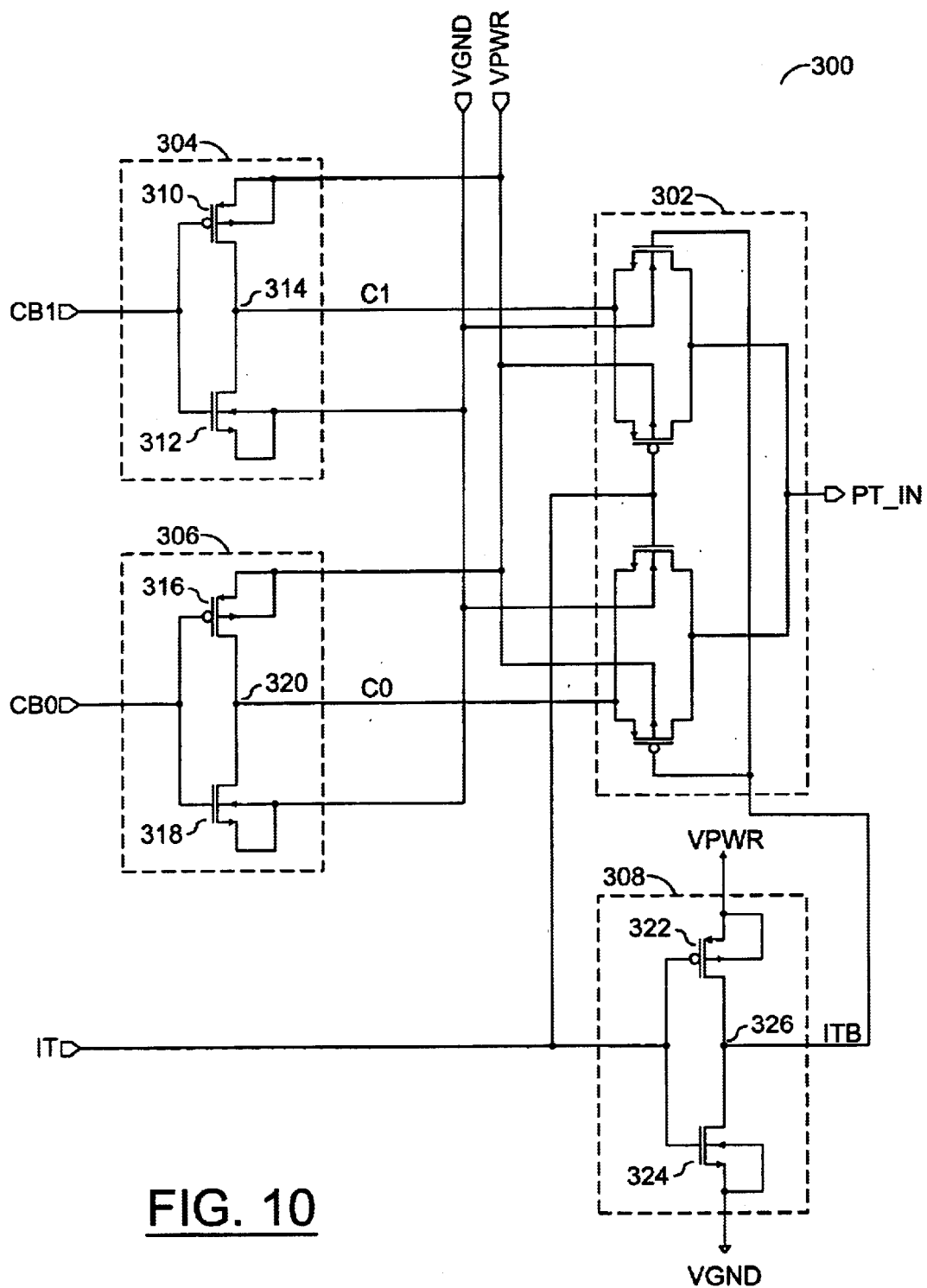
FIG. 10 is a schematic of an alternate embodiment of the present invention.

Referring to FIG. 10, a schematic diagram of a circuit 300 illustrating an alternative embodiment of the present invention is shown. The circuit 300 may comprise a circuit 302, a circuit 304, a circuit 306, and a circuit 308. The circuit 302 may be implemented similarly to the circuit 200 described in connection with FIGS. 7 and 8. The circuits 304, 306, and 308 may comprise, in one example, a CMOS transistor pair configured as an inverter circuit. A signal (e.g., CB0) may be presented to a gate of a transistor 310 and a transistor 312. A source of the transistor 310 may be connected to the supply voltage VPWR. A source of the transistor 312 may be connected to the ground supply VGND. A drain of the transistors 310 and 312 may be connected together to form an output node 314. The signal C0 may be presented at the output node 314 in response to the signal CB0.

A signal (e.g., CB1) may be presented to a gate of a transistor 316 and a transistor 318. A source of the transistor 316 may be connected to the supply voltage VPWR. A source of the transistor 318 may be connected to the ground supply VGND. A drain of the transistors 316 and 318 may be connected together to form an output node 320. The signal C1 may be presented at the output node 320 in response to the signal CB1.

The signal IT may be presented to a gate of a transistor 322 and a transistor 324. A source of the transistor 322 may be connected to the supply voltage VPWR. A source of the transistor 324 may be connected to the ground supply VGND. A drain of the transistors 322 and 324 may be connected together to form an output node 326. The signal ITB may be presented at the output node 326 in response to the signal IT.

The circuits 302–308 may be implemented with PMOS and NMOS transistors having substrate terminals. The substrate terminals of the PMOS transistors may be connected to the supply voltage VPWR. The substrate terminals of the NMOS transistors may be connected to the supply voltage ground VGND.

The present invention may provide a transmission gate based polarity switch having a programmable 0 or 1 override. A product term input circuit implemented in accordance with the present invention may provide the functions of previous product term input circuits with fewer transistors.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    an AND plane configured to generate a product term in response to a plurality of product term inputs; and
    a plurality of product term input circuits each configured (i) to receive an input signal and (ii) to generate one of said plurality of product term inputs, wherein each of said plurality of product term input circuits comprises (i) a first memory cell directly connected to an input terminal of a first transmission gate and (ii) a second memory cell directly connected to an input terminal of a second transmission gate, wherein (i) an output terminal of said first transmission gate is connected to an output terminal of said second transmission gate, (ii) said input signal is presented to a first control terminal of said first transmission gate and a first control terminal of said second transmission gate and (iii) said product term input is configurable in response to contents of said first memory cell and said second memory cell to present either (i) a signal that varies in response to said input signal or (ii) a predetermined logic level that is independent of said input signal.

2. The apparatus according to claim 1, wherein each of said first transmission gate and said second transmission gate further comprise a second control terminal configured to receive a complement of said input signal.

3. The apparatus according to claim 1, wherein said first memory cell and said second memory cell comprise a first configuration bit and a second configuration bit, respectively, of said apparatus.

4. The apparatus according to claim 1, wherein said output terminal of said first transmission gate and said output terminal of said second transmission gate are connected to an input of said AND plane.

5. The apparatus according to claim 1, wherein said input signal comprises an input term.

6. An apparatus comprising:
   an AND plane configured to generate a product term in response to a plurality of product term inputs;
   a first circuit configured to present a first value stored in a first memory cell as one of said plurality of product term inputs in response to a first state of an input signal; and
   a second circuit configured to present a second value stored in a second memory cell as said one of said plurality of product term inputs in response to a second state of said input signal, wherein (i) said first and said second stored values are programmable during configuration of said apparatus and (ii) said product term input is programmable as any of (i) said input signal, (ii) a digital complement of said input signal, and (iii) a predetermined logic level.

7. The apparatus according to claim 6, wherein:
   said first circuit comprises a first transmission gate configured to couple said first memory cell to an input terminal of said AND plane;
   said second circuit comprises a second transmission gate configured to couple said second memory cell to said input terminal of said AND plane; and
   said input signal is coupled to a control terminal of said first and said second transmission gates.

8. The apparatus according to claim 7, wherein each of said first transmission gate and said second transmission gate comprise a CMOS transistor pair.

9. The apparatus according to claim 7, wherein:
   said first circuit further comprises a first CMOS inverter coupling said first memory cell to said first transmission gate; and
   said second circuit further comprises a second CMOS inverter coupling said second memory cell to said second transmission gate.

10. The apparatus according to claim 7, wherein said product term input comprises (i) a predetermined logic level when said first and said second memory cells contain the same data and (ii) a signal that varies in response to said input signal when said first and said second memory cells contain different data.

11. The apparatus according to claim 10, wherein said data comprises configuration bits.

12. The apparatus according to claim 7, wherein said first memory cell and said second memory cell are configured to source and sink a current.

13. The apparatus according to claim 6, wherein said apparatus comprises a programmable logic device.

14. The apparatus according to claim 6 further comprising:
   a group of gates configured to generate a sum-of-products term in response to a plurality of product terms, wherein said AND plane is further configured to generate said plurality of product terms.

15. The apparatus according to claim 6, wherein said input signal comprises an input term.

16. The apparatus according to claim 6, wherein said predetermined logic level is selectable from a digital 0 and a digital 1.

17. A method for providing a product term input of a programmable logic device comprising the steps of:
   (A) presenting a first value stored in a first memory cell to an input node of an AND plane via a first transmission gate in response to a first state of an input signal; and
   (B) presenting a second value stored in a second memory cell to said input node of said AND plane via a second transmission gate in response to a second state of said input signal, wherein said first and said second stored values are programmed during configuration of said programmable logic device.

18. The method according to claim 17, wherein said product term input is programmable as any of (i) said input signal, (ii) a digital complement of said input signal, and (iii) a predetermined logic level.

19. The method according to claim 17, wherein said input signal comprises an input term of a logic block of said programmable logic device.

20. The method according to claim 17, further comprising the steps of:
   (C) generating a first logic level at said input node in response to said first and said second stored values being programmed with a first value;
   (D) generating a second logic level at said input node in response to said first and said second stored values being programmed with a second value;
   (E) generating a signal at said input node that has a state similar to said input signal in response to said first stored value being programmed with said first value and said second stored value being programmed with said second value; and
   (F) generating a signal at said input node that has a state similar to a digital complement of said input signal in is response to said first stored value being programmed with said second value and said second stored value being programmed with said first value.

* * * * *